(12) United States Patent  
Hirose et al.

(10) Patent No.: US 6,452,174 B1  
(45) Date of Patent: Sep. 17, 2002

(54) CHARGED PARTICLE BEAM APPARATUS AND METHOD OF CONTROLLING SAME

(75) Inventors: Yukinori Hirose; Kazuhito Honda, both of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/559,075

(22) Filed: Apr. 27, 2000

(30) Foreign Application Priority Data

Dec. 13, 1999 (JP) .......................................... 11-352805

(51) Int. Cl.$^7$ ............................................. H01J 37/244
(52) U.S. Cl. ..................... 250/309; 250/306; 250/307
(58) Field of Search ................................. 250/309, 306, 250/492.21, 307

(56) References Cited

U.S. PATENT DOCUMENTS 5,229,607 A * 7/1993 Matsui et al. ............... 250/306  
6,303,932 B1 * 10/2001 Hamamura et al. ......... 250/309

FOREIGN PATENT DOCUMENTS

| JP | 11-108813 | 4/1999 |
| JP | 11-258130 | 9/1999 |

OTHER PUBLICATIONS

K. Umemura, et al., Preprint of 46th Lecture on Applied Physics, 29p–ZF–3, p. 819, "Micro–Sampling Method for TEM Observation," 1999.

* cited by examiner

*Primary Examiner*—Kiet T. Nguyen  
(74) *Attorney, Agent, or Firm*—Oblon, Spivak, McClelland, Maier & Neustadt, P.C.

(57) ABSTRACT

An FIB apparatus (101) includes a probe (2) grounded through an ammeter (12). An FIB (1B) is directed to impinge upon a sample (5) while a driver (22) is controlled to gradually decrease a distance between the probe (2) and the sample (5). With the probe (2) in non-contacting relationship with the sample (5), current generated in the sample (5) by the FIB (1B) impingement flows inwardly of the sample (5). With the probe (2) in contacting relationship with the sample (5), on the other hand, the current generated in the sample (5) flows toward the probe (2). Thus, current flowing through the probe (2) increases when contact is made between the probe (2) and the sample (5). The contact between the probe (2) and the sample (5) is detected based on the amount of change in the current flowing through the probe (2) which is monitored by the ammeter (12). The FIB apparatus can reliably detect the contact between the probe and the sample without the need to provide an additional power supply for detection of the contact therebetween.

17 Claims, 20 Drawing Sheets

F I G. 4
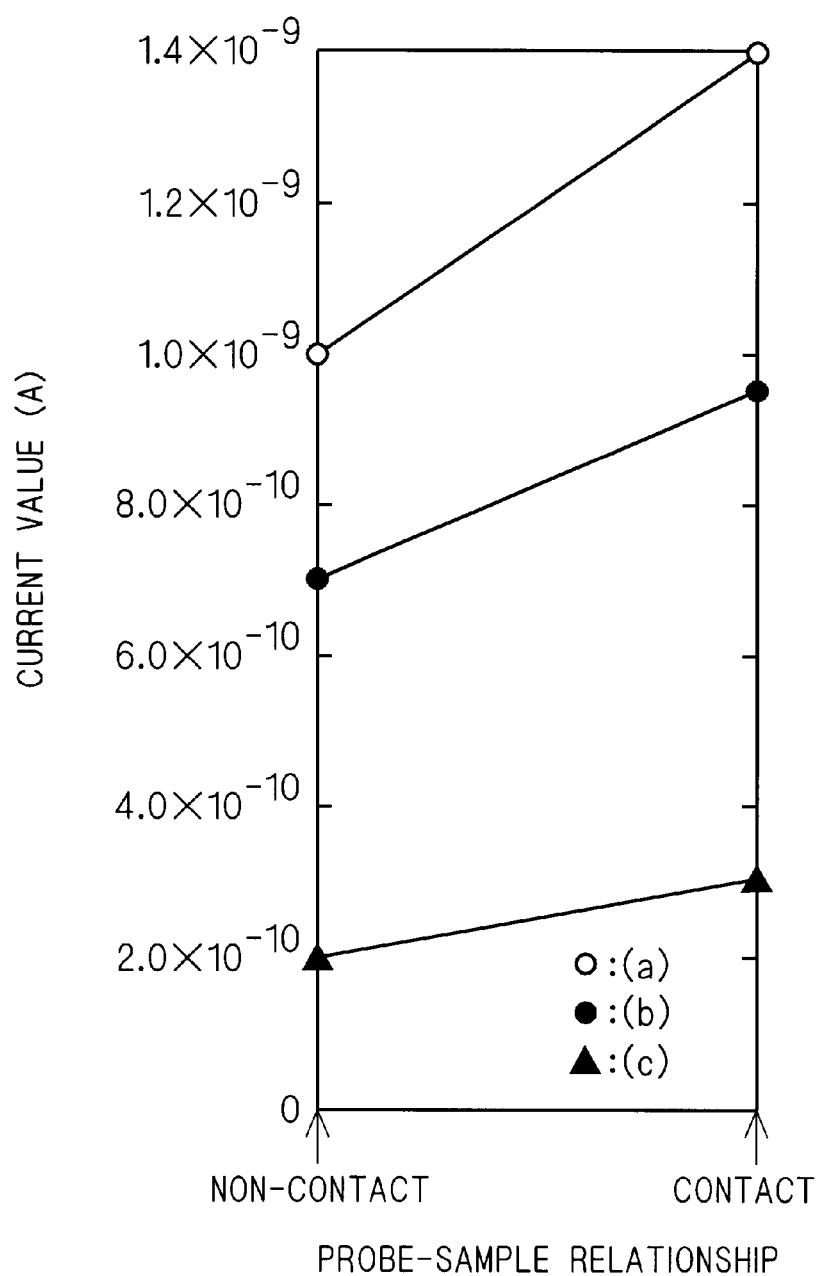

F I G. 16
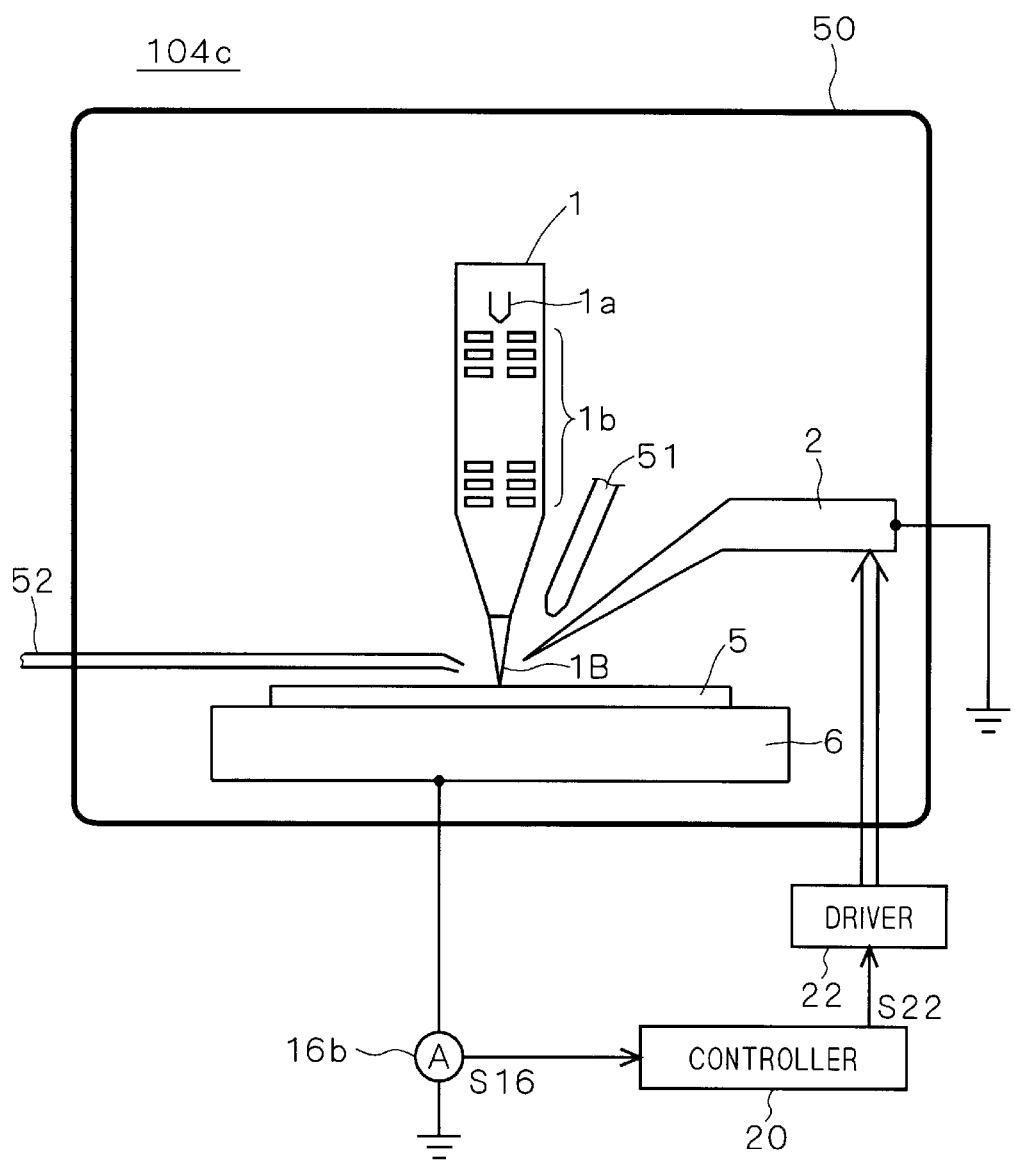

ns of the drawings by the charged particle beam is directed focused ion beam

CHARGED PARTICLE BEAM APPARATUS AND METHOD OF CONTROLLING SAME

BACKGROUND OF THE INVENTION

1. Field of the Invention

The present invention relates to a focused ion beam (referred to also as "FIB" hereinafter) apparatus for preparing a sample (referred to also as a "TEM sample" hereinafter) for use in observation by transmission electron microscopy (referred to also as a "TEM" hereinafter) and a method of controlling the FIB apparatus.

2. Description of the Background Art

In general, TEM observation has been carried out for evaluation and analysis of semiconductor devices. In this process, a TEM sample is prepared in a manner to be described below. First, a sample part of a certain size including a desired portion to be analyzed is cut out of an original sample, such as a semiconductor device or a wafer having a multiplicity of semiconductor devices manufactured therein, by cleaving or dicing. Thereafter, the sample part is thinned using an FIB to a thickness suitable for TEM observation. Such a two-step method is used to prepare the TEM sample including the portion to be analyzed.

Another method of preparing a TEM sample from an original sample using only an FIB without using the above-mentioned cutting such as cleaving is disclosed in, for example, Japanese Patent Application Laid-Open Nos. P11-108813A (1999) and P11-258130A (1999) in which also disclosed is a technique known as a micro-sampling technique or a micro-manipulation technique for use in the method of preparing the TEM sample.

In the micro-sampling technique, a tip of a probe is coupled to part of a future TEM sample portion before the TEM sample is completely cut out of the original sample. Thus, the probe can support and hold the TEM sample even after the TEM sample is completely cut out of the original sample. Further, the TEM sample supported by the probe may be transferred to, for example, a TEM sample stage. The coupling between the future TEM sample portion and the tip of the probe is provided in a manner to be described below. Contact is made between the future TEM sample portion and the tip of the probe, and thereafter a gas for deposition and an FIB are locally supplied to the contact. A resultant deposition film provides the coupling between the future TEM sample portion and the probe.

The micro-sampling technique involves the need to bring the future TEM sample portion and the tip of the probe into contact with each other before they are coupled to each other. Such contact is detected by an operator visually recognizing an image produced by, e.g., scanning ion microscopy (referred to also as "SIM" hereinafter). The SIM image is provided as a secondary electron image formed by FIB impingement.

However, such a detection method results in ambiguous detection since the operator judges whether or not the contact is made by visually observing the SIM image displayed on a monitor screen. For instance, the operator sometimes recognizes or detects the contact using the SIM image after some delay even though the future TEM sample portion and the tip of the probe are in contact with each other. Such delayed detection might cause the tip of the probe to damage the TEM sample, resulting in failure to cut out the desired portion to be analyzed.

SUMMARY OF THE INVENTION

According to a first aspect of the present invention, a focused ion beam apparatus comprises: a charged particle beam generator capable of generating at least a focused ion beam; a probe disposed in face-to-face relation with a sample; a driver for controlling a distance between the probe and the sample; and an ammeter electrically connected to at least one of the probe and the sample for measuring current flowing through at least one of the probe and the sample when the distance between the probe and the sample is decreased while a predetermined charged particle beam generated by the charged particle beam generator is directed onto at least the sample.

Preferably, according to a second aspect of the present invention, in the focused ion beam apparatus of the first aspect, the ammeter outputs a signal corresponding to a value of the current measured. The focused ion beam apparatus further comprises a controller receiving the signal for stopping controlling the distance between the probe and the sample by means of the driver, based on a change in the signal.

Preferably, according to a third aspect of the present invention, in the focused ion beam apparatus of the first or second aspect, the predetermined charged particle beam is the focused ion beam.

Preferably, according to a fourth aspect of the present invention, in the focused ion beam apparatus of the first or second aspect, the charged particle beam generator is also capable of generating an electron beam, and the predetermined charged particle beam is the electron beam.

A fifth aspect of the present invention is intended for a method of controlling a focused ion beam apparatus including a charged particle beam generator capable of generating at least a focused ion beam, a probe disposed in face-to-face relation with a sample, and a driver for controlling a distance between the probe and the sample. According to the present invention, the method comprises the steps of: measuring current flowing through at least one of the probe and the sample when the distance between the probe and the sample is decreased while a predetermined charged particle beam generated by the charged particle beam generator is directed onto at least the sample; and stopping controlling the distance between the probe and the sample, based on a change in the current.

Preferably, according to a sixth aspect of the present invention, in the method of the fifth aspect, the predetermined charged particle beam is the focused ion beam.

Preferably, according to a seventh aspect of the present invention, in the method of the fifth aspect, the charged particle beam generator is also capable of generating an electron beam, and the predetermined charged particle beam is the electron beam.

In accordance with the first aspect of the present invention, the ammeter electrically connected to the probe and/or the sample measures the current flowing through the probe and/or the sample when the distance between the probe and the sample is decreased while the predetermined charged particle beam generated by the charged particle beam generator is directed onto at least the sample. Since the value of the current differs depending on whether the probe and the sample are in contacting or non-contacting relationship, the contact/non-contact between the probe and the sample is detected by monitoring the current measured by the ammeter. Therefore, the focused ion beam apparatus of the first aspect of the present invention can greatly reduce a delay in detecting the contact to improve the detection precision, as compared with the technique of detecting the contact using a SIM image. Stopping controlling the distance between the probe and the sample when contact therebetween is made by using such high-precision detection significantly reduces damages to the sample. Consequently, cutting of a to-be-analyzed portion out of the sample and correct analysis thereof are accomplished by a so-called micro-sampling technique.

Additionally, the current measured by the ammeter corresponds to the current generated in the sample by the impingement of the predetermined charged particle beam. Thus, the focused ion beam apparatus of the first aspect of the present invention requires no additional power supply for detection of continuity between the probe and the sample, unlike the technique of detecting the contact/non-contact therebetween using continuity therebetween. Therefore, the focused ion beam apparatus of the first aspect can produce the above-mentioned effects in a simple and inexpensive configuration.

In accordance with the second aspect of the present invention, the controller receives the signal outputted from the ammeter and stops controlling the distance between the probe and the sample, based on a change in the signal. This allows the control of the distance between the probe and the sample to stop when the contact between the probe and the sample is detected. Thus, the focused ion beam apparatus of the second aspect can stop controlling the distance more reliably than the technique of stopping the control, for example, by manual operation. This further reduces damages to the sample. Consequently, more correct analysis of the to-be-analyzed portion cut out of the sample is accomplished.

In accordance with the third aspect of the present invention, the focused ion beam at least which the charged particle beam generator can generate is used as the charged particle beam. Thus, the charged particle beam generator need not include an additional charged particle beam generating mechanism for detection of the contact between the probe and the sample. Therefore, the focused ion beam apparatus of the third aspect can produce the effects of the first aspect in a simple configuration.

In accordance with the fourth aspect of the present invention, the electron beam is used as the predetermined charged particle beam. The electron beam sputters the sample to a smaller degree than does the focused ion beam. Further, the focused ion beam impingement sometimes causes ions in the focused ion beam to be introduced into the sample and act as an impurity during analysis. However, the electron beam does not cause such impurity introduction. Therefore, more correct analysis of the to-be-analyzed portion cut out of the sample can be accomplished.

In accordance with the fifth aspect of the present invention, the current flowing through the probe and/or the sample is measured when the distance between the probe and the sample is decreased while the predetermined charged particle beam generated by the charged particle beam generator is directed onto at least the sample. Since the value of the current differs depending on whether the probe and the sample are in contacting or non-contacting relationship, the contact/non-contact between the probe and the sample is detected by monitoring the current measured by the ammeter. Therefore, the method of the fifth aspect of the present invention can greatly reduce a delay in detecting the contact to improve the detection precision, as compared with the technique of detecting the contact using a SIM image. Stopping controlling the distance between the probe and the sample when contact therebetween is made by using such high-precision detection significantly reduces damages to the sample. Consequently, cutting of a to-be-analyzed portion out of the sample and correct analysis thereof are accomplished by a so-called micro-sampling technique.

In accordance with the sixth aspect of the present invention, effects similar to those of the third aspect are produced.

In accordance with the seventh aspect of the present invention, effects similar to those of the fourth aspect are produced.

It is therefore a primary object of the present invention to provide a focused ion beam apparatus having improved precision in detecting contact between a probe and a sample.

It is another object of the present invention to provide a focused ion beam apparatus which can achieve the primary object in a simple and inexpensive configuration.

It is still another object of the present invention to provide a focused ion beam apparatus which can reduce damages to a sample and the like when detecting contact between a probe and a sample.

It is a further object of the present invention to provide a method of controlling a focused ion beam apparatus which can achieve the above three objects.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a graph showing current flowing though a probe versus a probe-sample relationship in the FIB apparatus according to the first preferred embodiment;

FIG. 16 is a schematic view of a structure of the FIB apparatus according to a first modification of the fourth preferred embodiment;

DESCRIPTION OF THE PREFERRED EMBODIMENTS

In the following description, a direction in which current flows shall be defined as a direction opposite from a direction in which electrons flow.

<First Preferred Embodiment>

A. Structure of FIB Apparatus

Figure 1:
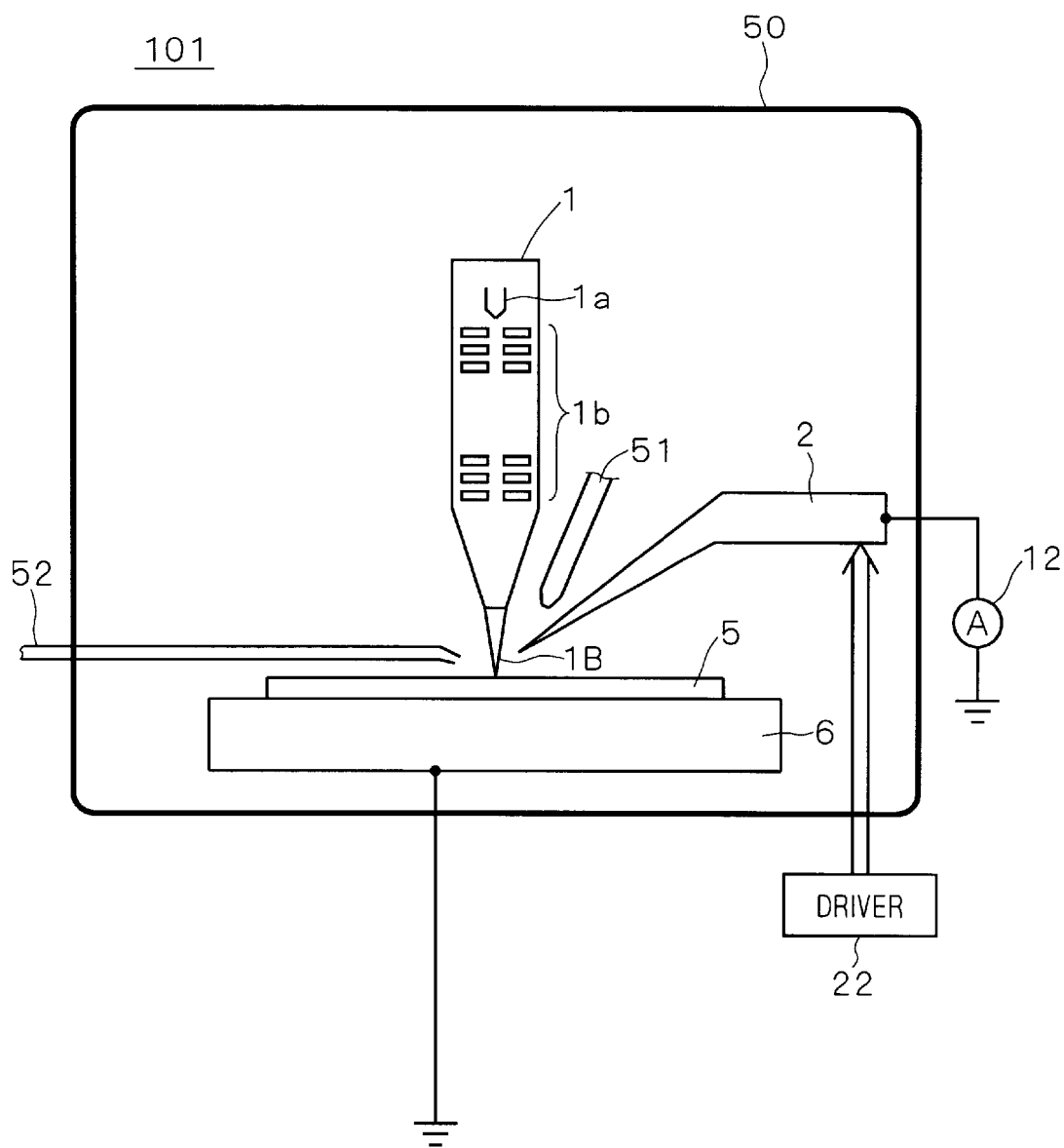
FIG. 1 is a schematic view of a structure of an FIB apparatus according to a first preferred embodiment of the present invention.

FIG. 1 is a schematic view of a structure of an FIB apparatus 101 according to a first preferred embodiment of the present invention. As shown in FIG. 1, the FIB apparatus 101 comprises a vacuum chamber 50 in which a sample stage 6 for placing thereon a sample 5 such as a wafer having a plurality of semiconductor devices manufactured therein, and a probe 2 are disposed. In particular, the sample stage 6 and the probe 2 are made of a conductive material. Thus, an electric connection is established between the sample stage 6 and the sample 5. The sample stage 6 is grounded.

The probe 2 is movable in various directions by a driver 22 for the probe 2. The driver 22 can control a distance between the probe 2 and the sample 5. Various known mechanisms for linearly moving the probe 2, for example, in horizontal and vertical directions may be used as the driver 22. Further, for example, a piezoelectric device may be used to control slight movement of the probe 2.

In particular, the probe 2 of the FIB apparatus 101 is grounded through an ammeter 12 which can measure current flowing through the probe 2.

The FIB apparatus 101 further comprises an FIB generator or an FIB optical system 1 disposed in face-to-face relation with the sample stage 6, with the sample 5 therebetween. The FIB generator 1 includes a source 1a of ions of, e.g., gallium (Ga) and a lens system 1b comprising a convergent lens, an objective lens and the like, and can generate an FIB 1B and direct the FIB 1B to impinge upon the sample 5. Various known FIB generators may be used as the FIB generator 1. Although the FIB generator 1 is shown in FIG. 1 as disposed entirely in the vacuum chamber 50, the FIB generator 1 may be disposed partially or entirely outside the vacuum chamber 50 so far as the FIB generator 1 can introduce the FIB 1B into the vacuum chamber 50.

The FIB apparatus 101 further comprises a secondary particle detector 51 for detecting secondary electrons, secondary ions and the like generated by the impingement of the FIB 1B, and a gas inlet pipe 52 for supplying a gas for deposition of a film to a region in which the FIB 1B is to be introduced.

B. Principle of Detection of Contact between Probe and Sample in FIB Apparatus

Figure 2:
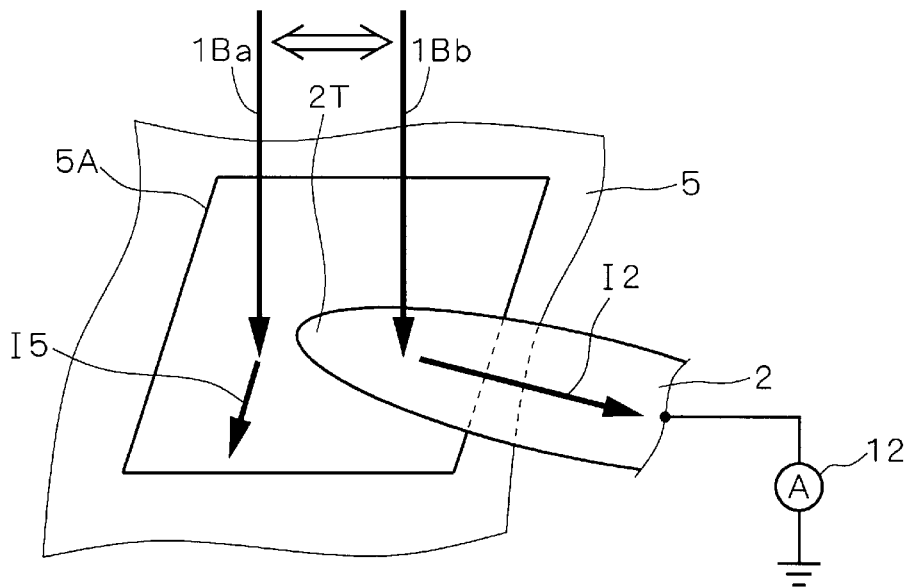
FIGS. 2 and 3 are schematic views for illustrating the principle of operation of the FIB apparatus according to the first preferred embodiment.
Figure 3:
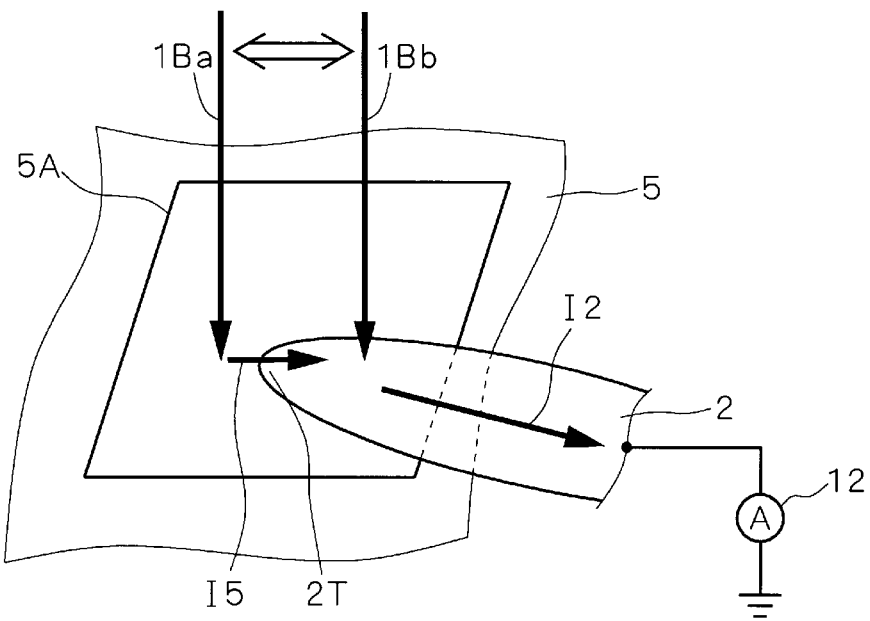

The principle of a method of detecting contact between the probe 2 and the sample 5 in the FIB apparatus 101 will be described with reference to FIGS. 1, 2 and 3. FIG. 2 is a schematic view of the probe 2 in non-contacting relationship with the sample 5, and FIG. 3 is a schematic view of the probe 2 when contacting the sample 5.

In the FIB apparatus 101, the FIB 1B is directed to impinge upon the sample 5 when the driver 22 is controlled to decrease the distance between the probe 2 and the sample 5. More specifically, the FIB 1B scans a scanning region 5A lying in the vicinity of part of the sample 5 which is to be contacted with a tip 2T of the probe 2. The FIB used for the scanning has a lower energy than the FIB used to cut out the TEM sample. In FIGS. 2 and 3, such scanning is schematically illustrated with two FIBs: an FIB 1B$a$ directed onto the sample 5 and an FIB 1B$b$ directed onto the probe 2.

The scanning operation when the probe 2 and the sample 5 are in non-contacting relationship is described below. When the FIB 1B is directed onto the surface of the sample 5 (See FIB 1B$a$ of FIG. 2), a current I5 is generated in the sample 5 and flows inwardly of the sample 5. The current I5 finally becomes an absorption current or a sample current.

On the other hand, when the FIB 1B is directed onto the probe 2 (See FIB 1B$b$ of FIG. 2) in this scanning operation, a current I2 is generated which is directed from the probe 2 toward the ammeter 12.

Next, the driver 22 is controlled to gradually decrease the distance between the probe 2 and the sample 5 until the probe 2 comes into contact with the sample 5, which will be described below. When the FIB 1B is directed onto the probe 2 (See FIB 1B$b$ of FIG. 3) in this scanning operation, the current I2 flows through the probe 2, in a manner similar to the current I2 flowing when the probe 2 and the sample 5 are in the above-mentioned non-contacting relationship.

On the other hand, when the FIB 1B is directed onto the surface of the sample 5 (See FIB 1B$a$ of FIG. 3), the current I5 generated in the sample 5, unlike the current I5 flowing when the probe 2 and the sample 5 are in the above-mentioned non-contacting relationship, flows toward the probe 2. Therefore, the current flowing through the probe 2 is higher when the probe 2 and the sample 5 are in the contacting relationship than when they are in the non-contacting relationship. Conversely, the current flowing through the sample 5 and the sample stage 6 is lower when the probe 2 and the sample 5 are in the contacting relationship than when they are in the non-contacting relationship.

Utilizing this, the FIB apparatus 101 detects the contact between the probe 2 and the sample 5 based on a change in the value of current flowing through the probe 2 which is monitored by the ammeter 12. The scanning of the FIB 1B in the above description is intended to recognize a rough positional relationship between the probe 2 and the sample 5 by using the SIM image. Thus, the detection of the contact between the probe 2 and the sample 5 requires directing the FIB 1B at least onto the sample 5. Further, the ammeter 12 can detect the current flowing through the probe 2 if the probe 2 is made of a conductive material at least between part thereof for contact with the sample 5 and part thereof for connection to the ammeter 12.

Table 1 shows results of measurement of current flowing through the probe 2 for various settings of the current of the FIB 1B or a primary beam current and impingement conditions of the FIB 1B.

TABLE 1

| primary beam current (A) | FIB impingement conditions | current (A) | | |
| --- | --- | --- | --- | --- |
| | | non-contact | contact | ΔI |
| (a) $1.5 \times 10^{-9}$ | Ap 1 0.2 sec/frame X1000 | $1.0 \times 10^{-9}$ | $1.4 \times 10^{-9}$ | $4.0 \times 10^{-10}$ |
| (b) $1.5 \times 10^{-9}$ | Ap 1 TV mode X1000 | $7.0 \times 10^{-10}$ | $9.5 \times 10^{-10}$ | $2.5 \times 10^{-10}$ |
| (c) $4.0 \times 10^{-10}$ | Ap 2 TV mode X2000 | $2.0 \times 10^{-10}$ | $3.0 \times 10^{-10}$ | $1.0 \times 10^{-10}$ |

As shown in Table 1, the conditions (a) are: $1.5 \times 10^{-9}$ A current of the FIB 1B; an aperture size of 1 (denoted as "Ap 1" in Table 1); a scan rate of 0.2 second/frame; and ×1000 magnification at which the SIM image is observed for recognition of the rough positional relationship between the probe 2 and the sample 5. The numerical value indicative of the aperture size is a relative value. The lower the numerical value, the larger the aperture size. The conditions (b) are: $1.5 \times 10^{-9}$ A current of the FIB 1B; an aperture size of 1; a TV mode scan rate (higher than the above scan rate of 0.2 second/frame); and ×1000 magnification. The conditions (c) are: $4.0 \times 10^{-10}$ A current of the FIB 1B; an aperture size of 2 (indicating a smaller aperture than Ap 1); a TV mode scan rate; and ×2000 magnification.

Under the conditions (a), the current flowing through the probe 2 is $1.0 \times 10^{-9}$ A when the probe 2 and the sample 5 are in non-contacting relationship, and is $1.4 \times 10^{-9}$ A when they are in contacting relationship. Therefore, the amount of change or a difference ΔI is $4.0 \times 10^{-10}$ A under the conditions (a). Under the conditions (b), the current flowing through the probe 2 is $7.0 \times 10^{-10}$ A when the probe 2 and the sample 5 are in non-contacting relationship, and is $9.5 \times 10^{-10}$ A when they are in contacting relationship. Therefore, the amount of change ΔI is $2.5 \times 10^{-10}$ A under the conditions (b). Under the conditions (c), the current flowing through the probe 2 is $2.0 \times 10^{-10}$ A when the probe 2 and the sample 5 are in non-contacting relationship, and is $3.0 \times 10^{-10}$ A when they are in contacting relationship. Therefore, the amount of change ΔI is $1.0 \times 10^{-10}$ A under the conditions (c).

FIG. 4 is a graph showing the results of measurement of Table 1. The open circles (○), solid circles (●) and solid triangles (▲) of FIG. 4 correspond to the conditions (a), (b) and (c) of Table 1, respectively.

C. Method of Controlling FIB Apparatus for Contact Detection

Figure 5:
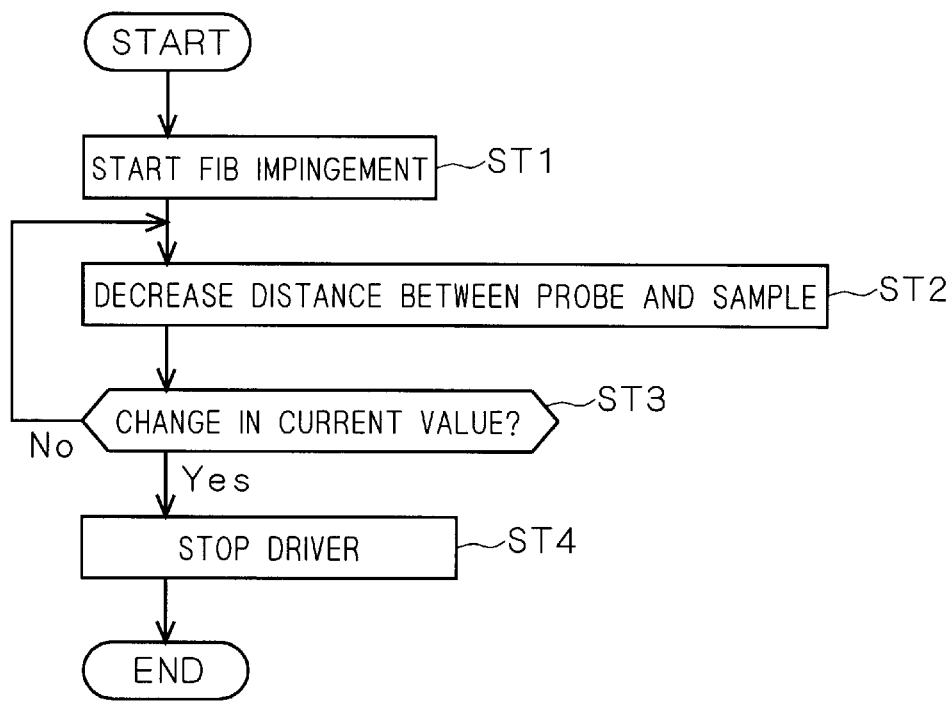
FIG. 5 is a flow chart for illustrating a method of controlling the FIB apparatus according to the first preferred embodiment.

A method of controlling the FIB apparatus 101 when detecting the contact between the probe 2 and the sample 5 will be described with reference to the flowchart of FIG. 5.

First, the FIB impingement is started (Step ST1). Then, the driver 22 is controlled to gradually decrease the distance between the probe 2 and the sample 5 (Step ST2). A judgement is made as to whether or not there is a change in the current value monitored by the ammeter 12 (Step ST3). In other words, whether or not contact between the probe 2 and the sample 5 is made is judged in Step ST3. If no change in the current value is detected and it is accordingly judged that the contact between the probe 2 and the sample 5 has not yet been made in Step ST3, the flow returns to Step ST2. If there is a change in the current value and it is accordingly judged that the contact between the probe 2 and the sample 5 is made in Step ST3, the operation of the driver 22 is stopped, e.g., manually (Step ST4).

The order in which Steps ST1 and ST2 are started may be reversed so far as the FIB impingement starts before the contact between the probe 2 and the sample 5 is made. Alternatively, Steps ST1 and ST2 may be started at the same time. In other words, Steps ST1 and ST2 are required to gradually decrease the distance between the probe 2 and the sample 5 while the FIB 1B is directed onto at least the sample 5.

The FIB apparatus 101 can produce effects to be described below. The ammeter 12 monitors the current flowing through the probe 2 to detect the contact between the probe 2 and the sample 5 based on a change in the monitored current.

Therefore, the FIB apparatus 101 of the first preferred embodiment can greatly reduce the delay in detecting the contact to improve the detection precision, as compared with the conventional FIB apparatus which detects the contact using the SIM image. This significantly reduce damages to the sample 5, particularly the future TEM sample portion. Consequently, correct analysis using the cut TEM sample can be carried out.

Additionally, the FIB apparatus 101 carries out the FIB 1B impingement to measure the current generated by the impingement when decreasing the distance between the probe 2 and the sample 5, requiring no additional power supply between the probe 2 and the sample 5 when detecting the contact using continuity therebetween. Therefore, the FIB apparatus 101 can detect the contact in a simple and inexpensive configuration.

<First Modification of First Preferred Embodiment>

Figure 6:
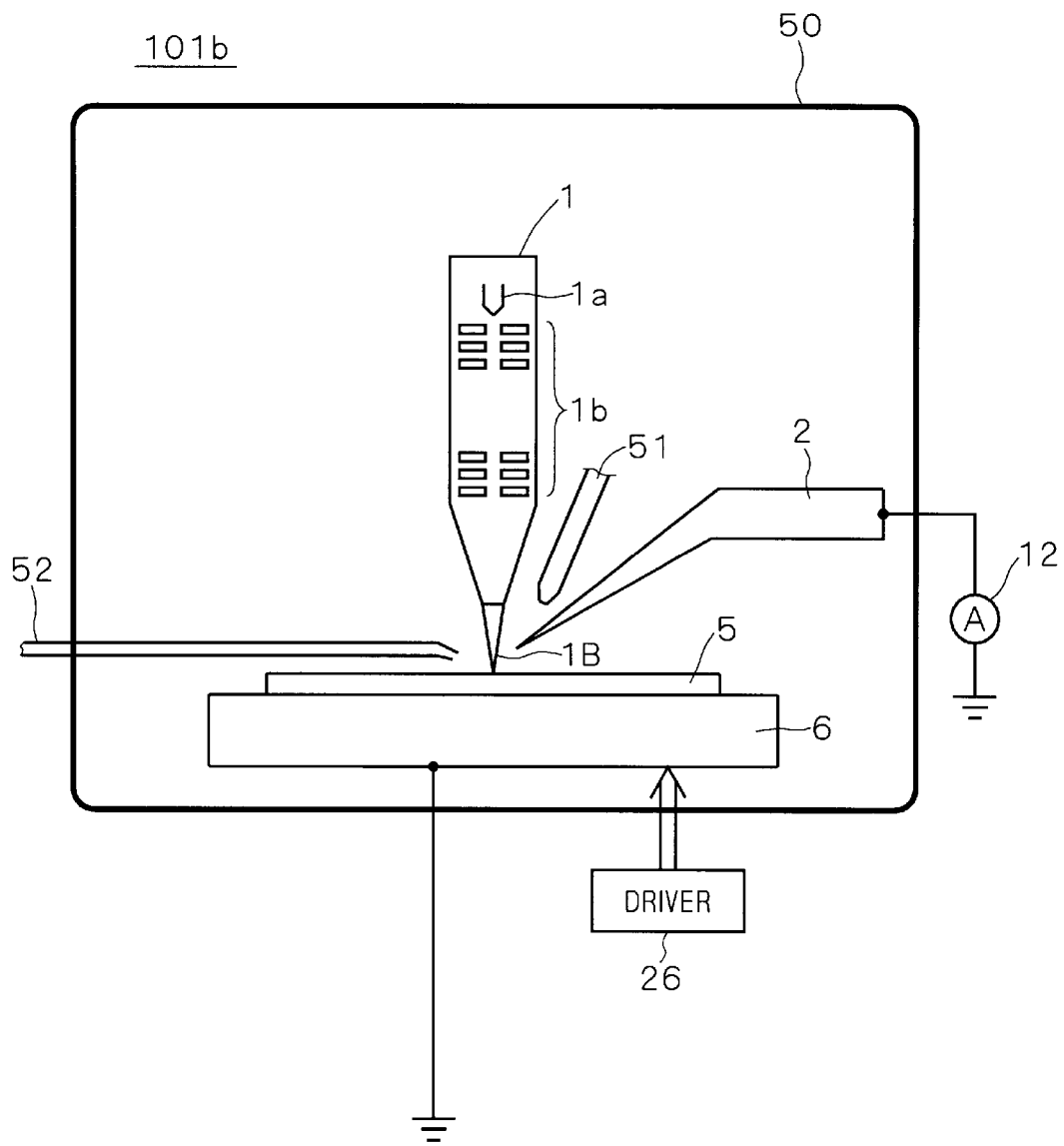
FIG. 6 is a schematic view of a structure of the FIB apparatus according to a first modification of the first preferred embodiment.
Figure 7:
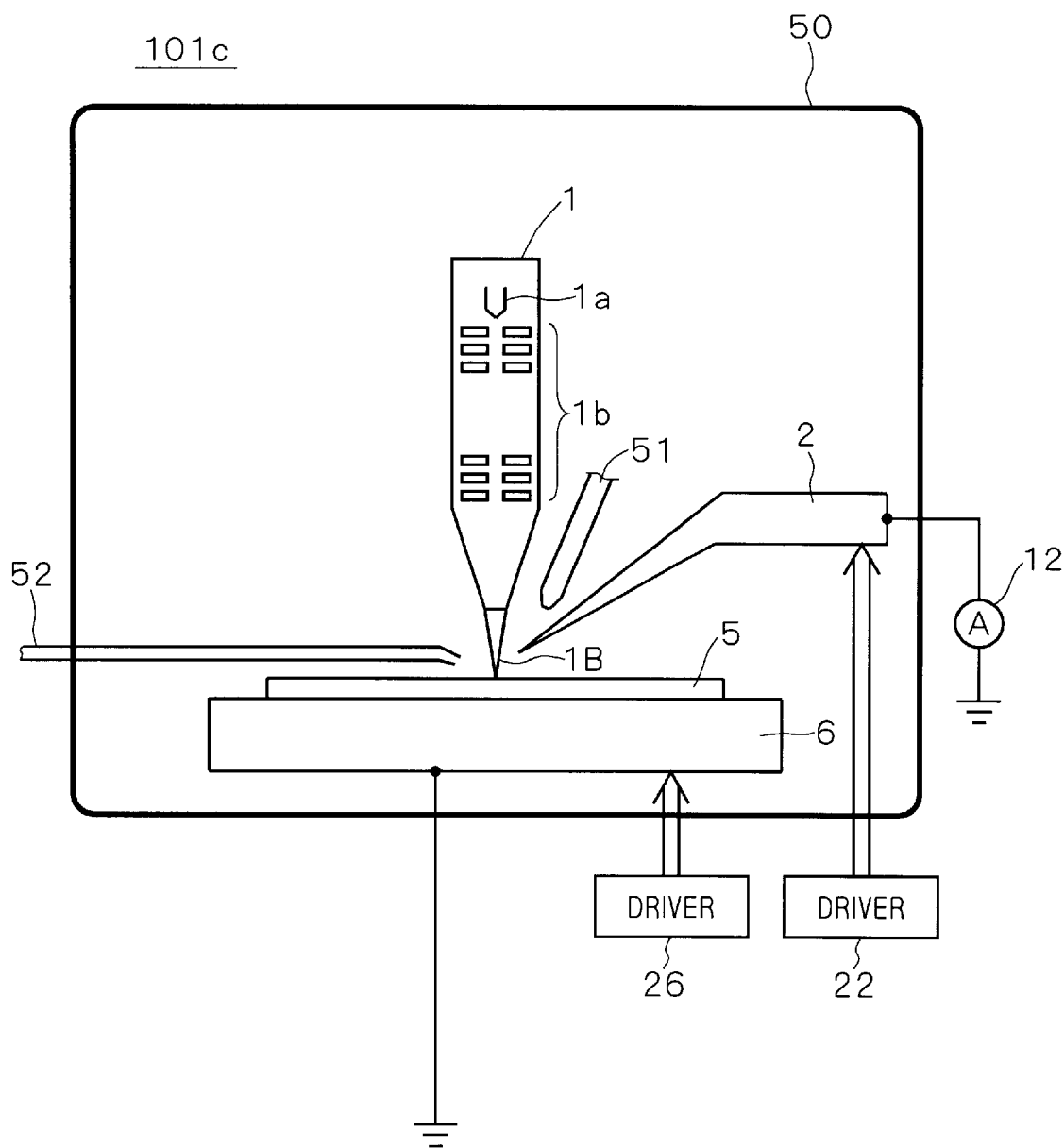
FIG. 7 is a schematic view of another structure of the FIB apparatus according to the first modification of the first preferred embodiment.

With reference to FIG. 6, an FIB apparatus 101b may be employed which comprises a driver 26 for the sample stage 6 in place of the driver 22 for the probe 2. Such a driver 26 can also control the distance between the probe 2 and the sample 5. For example, the above-mentioned mechanisms for linear movement may be used as the driver 26. Further, various known mechanisms for controlling the rotation of the sample stage 6 in a horizontal plane, the inclination of the sample stage 6 with respect to the horizontal, and the like may be added to the driver 26. Alternatively, an FIB apparatus 101c as shown in FIG. 7 may be employed which comprises both of the drivers 22 and 26.

<Second Preferred Embodiment>

An FIB apparatus 102 according to a second preferred embodiment of the present invention will be described with reference to FIG. 8. Description will be given with emphasis on the difference from the FIB apparatus 101 (See FIG. 1). Like reference numerals and characters are used to designate components identical with those described above, and the above detailed description about the components shall apply to the FIB apparatus 102 and other FIB apparatuses to be described later.

Figure 8:
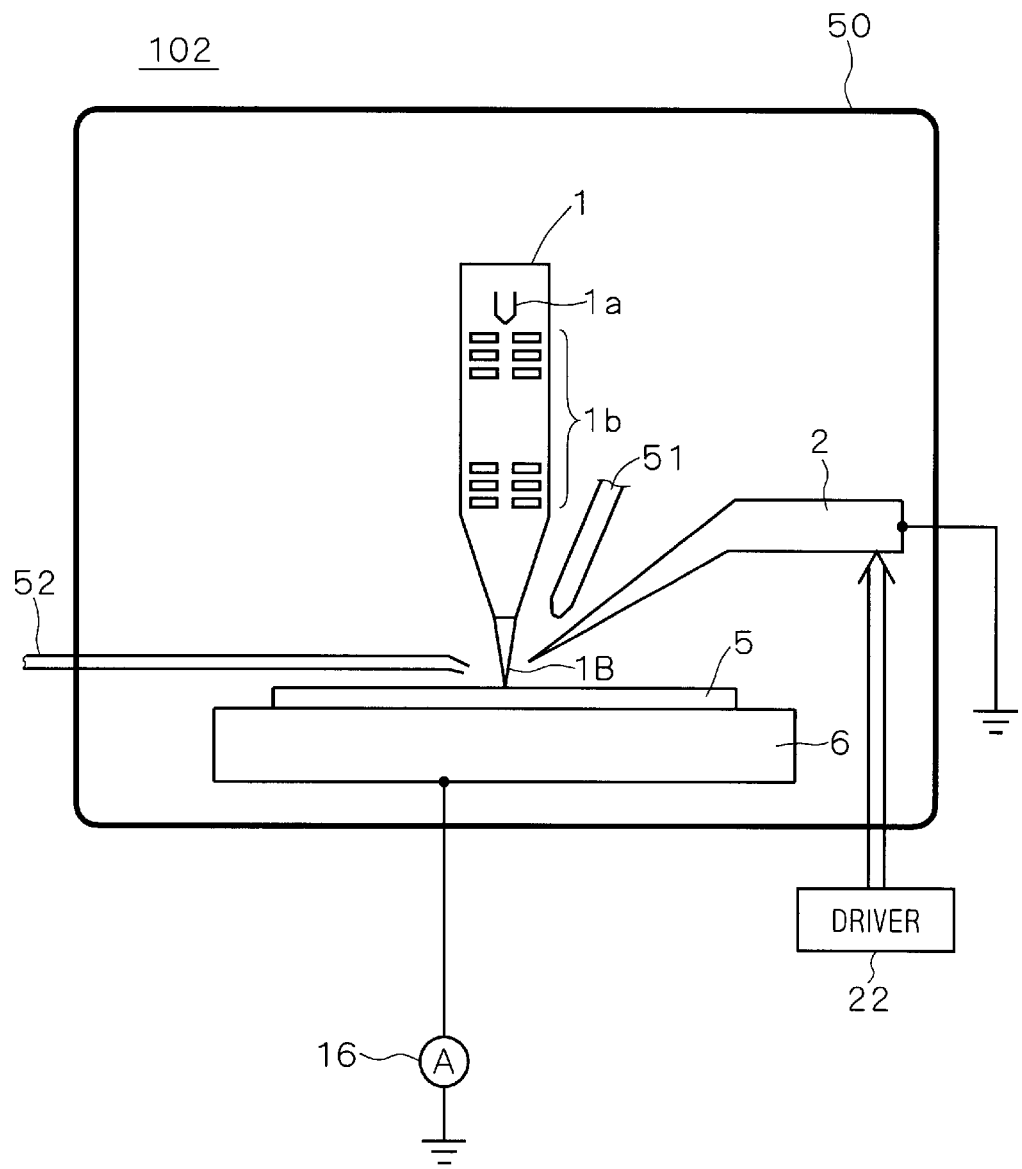
FIG. 8 is a schematic view of a structure of the FIB apparatus according to a second preferred embodiment of the present invention.

A comparison between FIGS. 1 and 8 shows that the sample stage 6 of the FIB apparatus 102 is grounded through an ammeter 16. In other words, an electric connection is established between the sample 5 and the ammeter 16. The ammeter 16 is identical with the above-mentioned ammeter 12. On the other hand, the probe 2 is grounded through no ammeter.

As stated above, with the FIB 1B directed onto the surface of the sample 5 (See FIB 1Ba of FIG. 3), the current flowing through the sample 5 and the sample stage 6 is lower when the probe 2 and the sample 5 are in the contacting relationship than when they are in the non-contacting relationship. With the foregoing in mind, the FIB apparatus 102 detects the contact between the probe 2 and the sample 5 based on a change in current flowing through the sample 5 and the sample stage 6 which is monitored by the ammeter 16. The FIB apparatus 102 produces effects similar to those produced by the FIB apparatus 101.

The ammeter 16 can detect the current flowing through the sample 5 if the sample stage 6 is made of a conductive material at least between part thereof for contact with the sample 5 and part thereof for connection to the ammeter 16.

Figure 9:
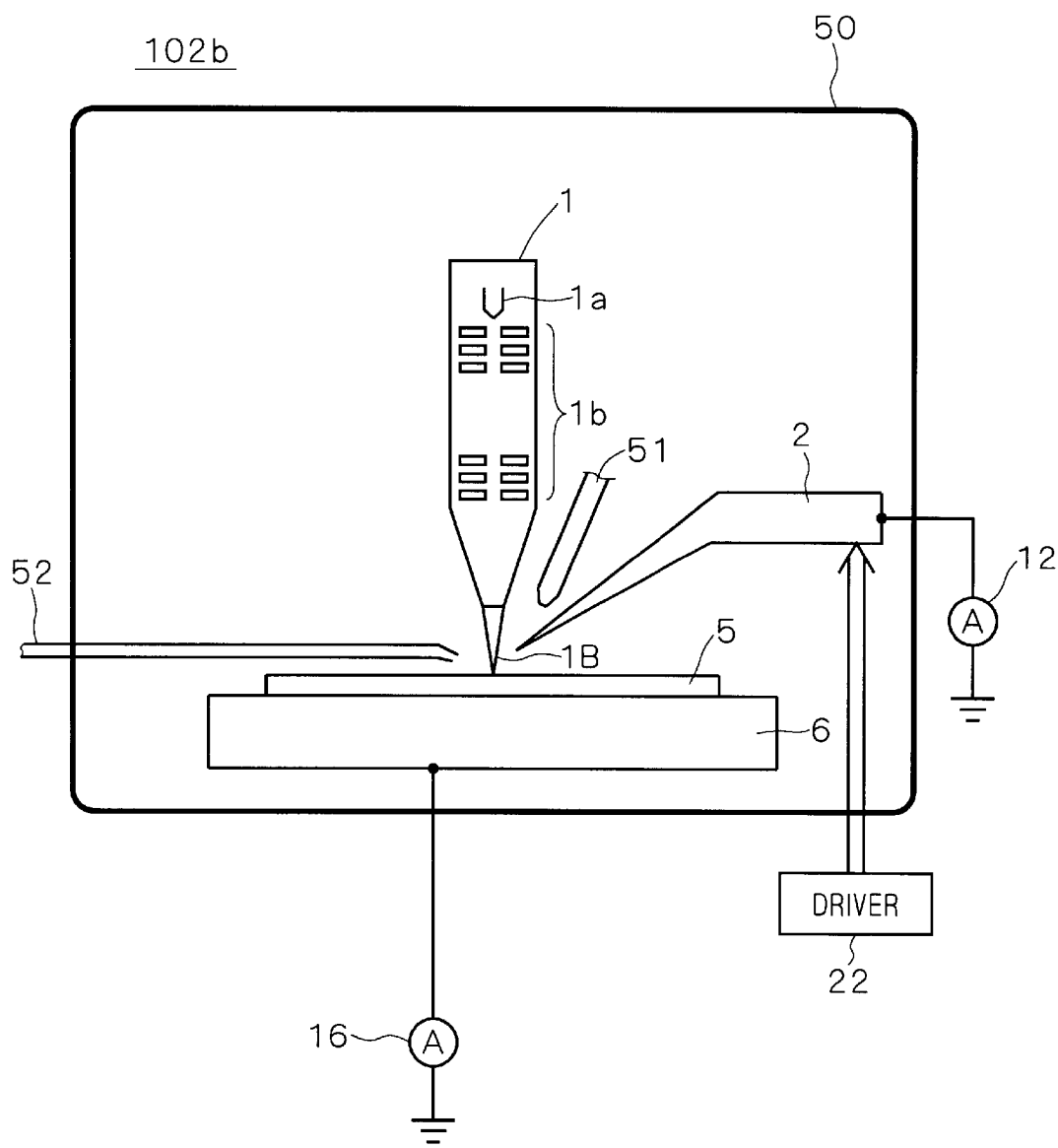
FIG. 9 is a schematic view of another structure of the FIB apparatus according to the second preferred embodiment.

With reference to FIG. 9, an FIB apparatus 102b may be employed which comprises the two ammeters 12 and 16. Further, the FIB apparatuses 101b and 101c may comprise the ammeter 16 in place of or in addition to the ammeter 12.

<Third Preferred Embodiment>

Figure 10:
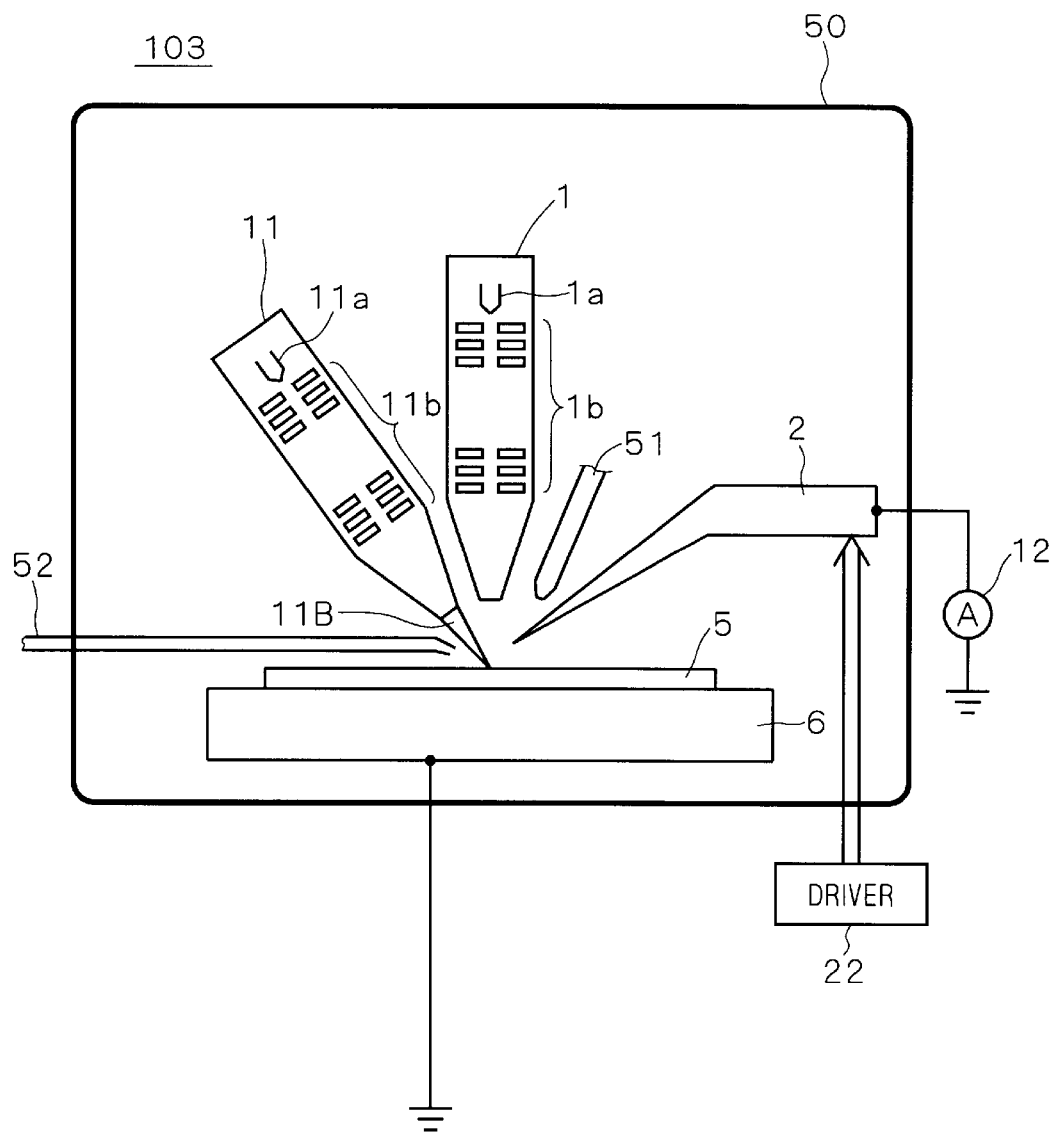
FIG. 10 is a schematic view of a structure of the FIB apparatus according to a third preferred embodiment of the present invention.

An FIB apparatus 103 according to a third preferred embodiment of the present invention will be described with reference to FIG. 10. A comparison between FIGS. 1 and 10 shows that the FIB apparatus 103 comprises an electron beam generator or an electron beam optical system 11 in addition to the components of the FIB apparatus 101.

More specifically, the electron beam generator 11 is disposed in face-to-face relation with the sample stage 6, with the sample 5 therebetween. The electron beam generator 11 includes an electron gun or a cathode 11a and a lens system 11b comprising a convergent lens and the like, and can generate an electron beam 11B and direct the electron beam 11B to impinge upon the sample 5. Various known electron beam generators may be used as the electron beam generator 11. Although the electron beam generator 11 is shown in FIG. 10 as disposed entirely in the vacuum chamber 50, the electron beam generator 11 may be disposed partially or entirely outside the vacuum chamber 50 so far as the electron beam generator 11 can introduce the electron beam 11B into the vacuum chamber 50.

The FIB apparatus 103 differs from the FIB apparatus 101 and the like in directing the electron beam 11B, rather than the FIB 1B (See FIG. 1), onto the sample 5 in the step of detecting the contact between the probe 2 and the sample 5 while gradually decreasing the distance between the probe 2 and the sample 5. At this time, the current flowing through the probe 2 differs depending on whether the probe 2 and the sample 5 are in contacting or non-contacting relationship, as in the case of the FIB 1B impingement. Utilizing this, the FIB apparatus 103 detects the contact between the probe 2 and the sample 5 based on a change in the current flowing through the probe 2 which is monitored by the ammeter 12.

The direction of the current flowing through the probe 2 or the current flowing through the ammeter 12 changes in some cases depending on the impingement conditions of the electron beam 11B such as an accelerating voltage and the incident angle of the electron beam. However, the use of constant impingement conditions in the step of detecting the contact allows the detection of a change in the current flowing through the probe 2.

Figure 11:
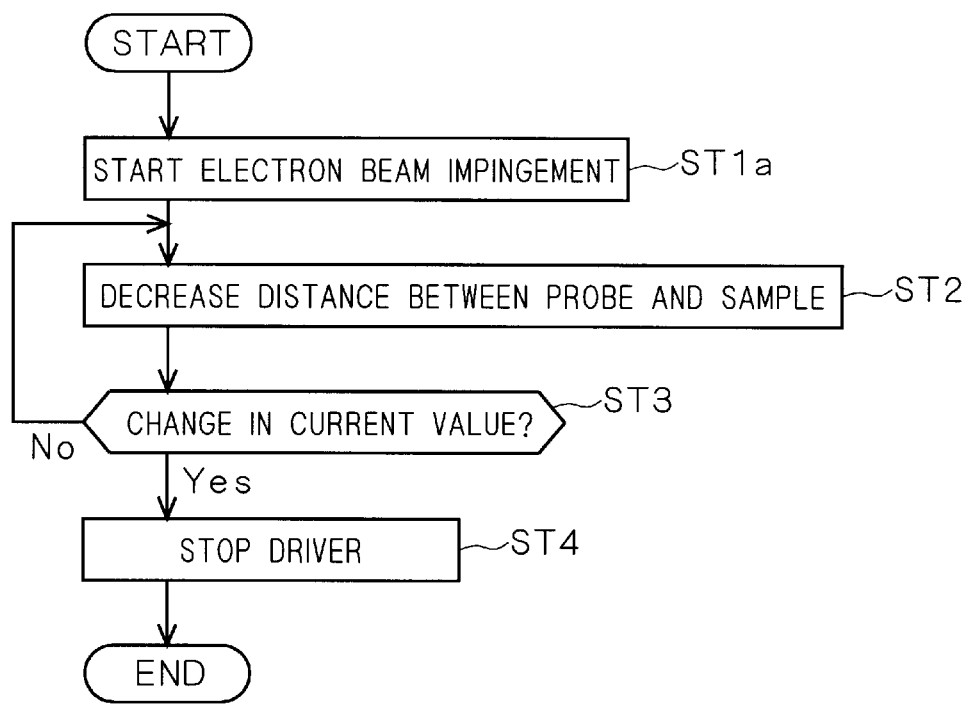
FIG. 11 is a flow chart for illustrating a method of controlling the FIB apparatus according to the third preferred embodiment.

FIG. 11 is a flowchart for illustrating a method of controlling the FIB apparatus 103 when detecting the contact between the probe 2 and the sample 5. As shown in FIG. 11, the electron beam impingement is started in Step ST1a of this method which corresponds to Step ST1 of FIG. 5. Subsequent Steps ST2 to ST4 of FIG. 11 are similar to those of FIG. 5. Steps ST1a and ST2 are required to gradually decrease the distance between the probe 2 and the sample 5 while the electron beam 11B is directed onto at least the sample 5.

The FIB apparatus 103 can produce effects to be described below in addition to the effects produced by the FIB apparatus 101. The electron beam 11B sputters the sample 5 to a smaller degree than does the FIB 1B because of the difference in charged particle beam. Further, the FIB 1B impingement sometimes causes ions, e.g. Ga ions, in the FIB 1B to be introduced into the sample 5 and act as an impurity during the analysis of the TEM sample. However, the electron beam 11B does not cause such impurity introduction. Therefore, more correct analysis of the TEM sample cut from the sample 5 can be carried out.

The FIB apparatus 103 may carry out the FIB impingement when detecting the contact between the probe 2 and the sample 5 in a manner similar to the above-mentioned FIB apparatus 101 and the like.

Figure 12:
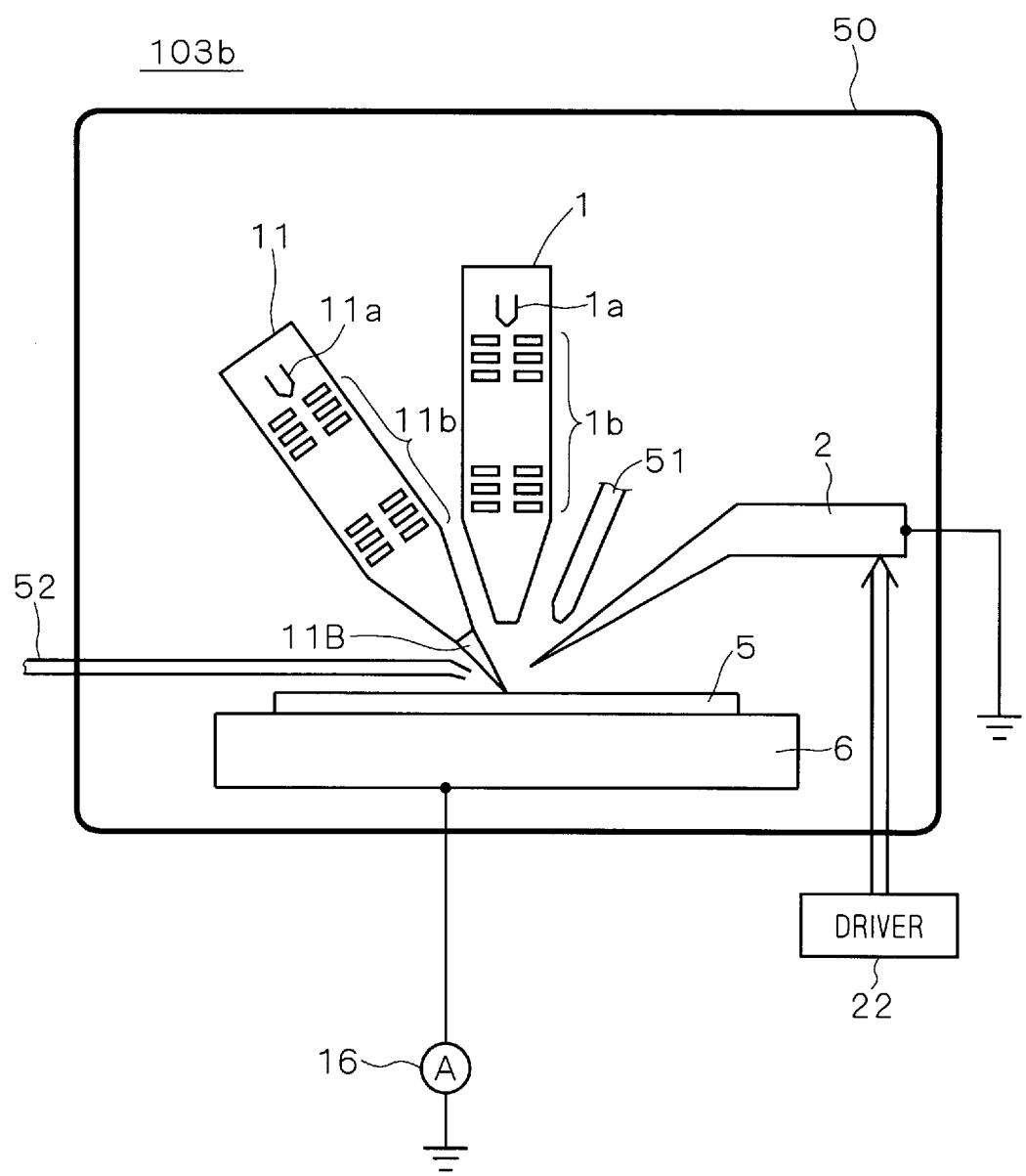
FIG. 12 is a schematic view of another structure of the FIB apparatus according to the third preferred embodiment.

An FIB apparatus 103b as shown in FIG. 12 may be employed which comprises the electron beam generator 11 in addition to the components of the above-mentioned FIB apparatus 102 (See FIG. 8), thereby to produce similar effects. Further, the above-mentioned FIB apparatuses 101b, 101c, 102b and the like may comprise the electron beam generator 11.

In the case where the FIB apparatus, such as the FIB apparatuses 103 and 103b according to the third preferred embodiment, comprises both of the FIB generator and the electron beam generator, a structure comprising the FIB generator and the electron beam generator corresponds to a "charged particle beam generator." In the case of the FIB apparatuses 101, 102 and the like according to the first and second preferred embodiments, the FIB generator itself corresponds to the "charged particle beam generator." The charged particle beam generator of the FIB apparatuses 101, 102 and the like according to the first and second preferred embodiments is simpler in construction.

<Fourth Preferred Embodiment>

Figure 13:
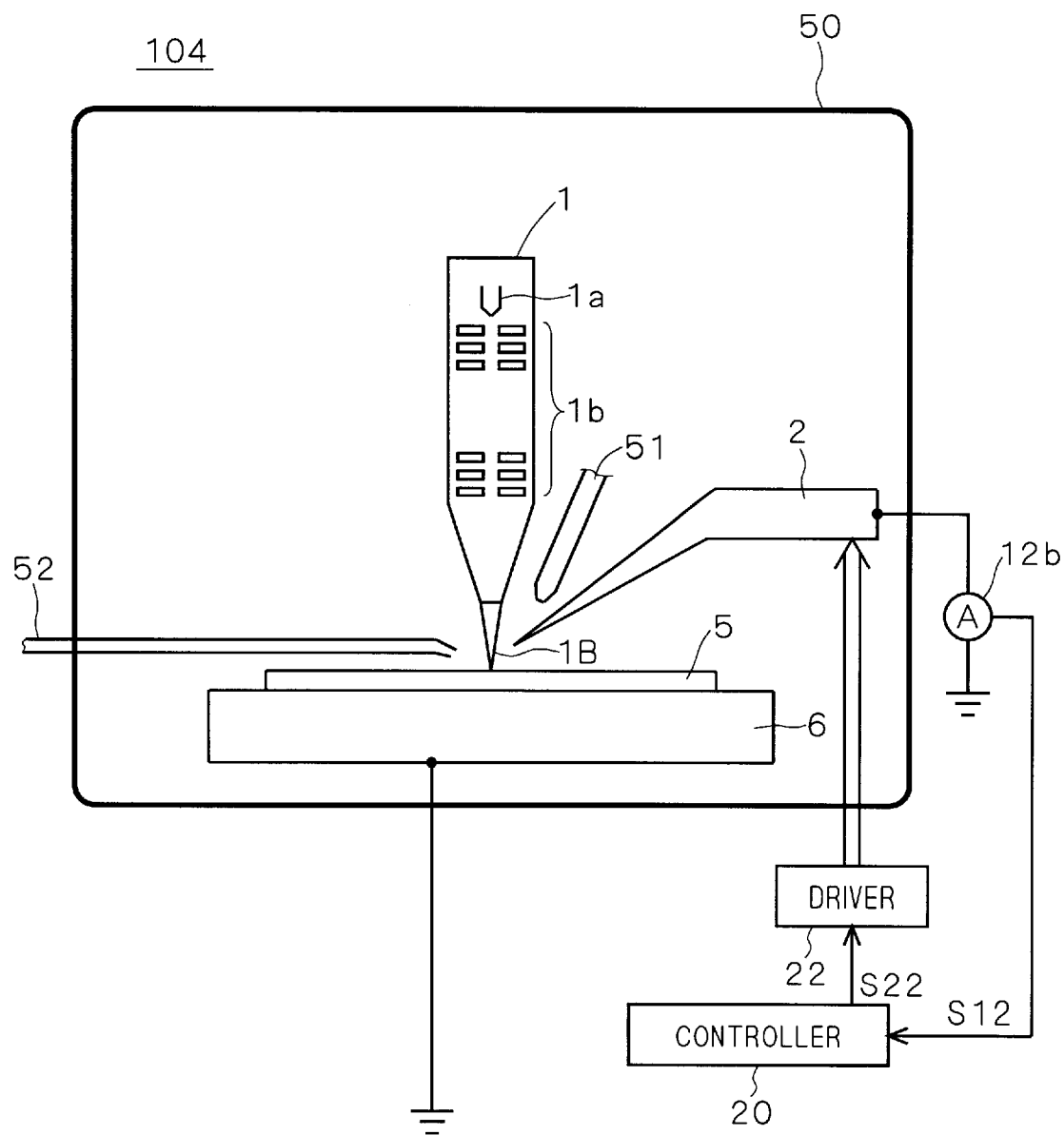
FIG. 13 is a schematic view of a structure of the FIB apparatus according to a fourth preferred embodiment of the present invention.

An FIB apparatus 104 according to a fourth preferred embodiment of the present invention will be described with reference to FIG. 13. A comparison between FIGS. 1 and 13 shows that the FIB apparatus 104 comprises an ammeter 12b which is capable of outputting a signal S12 corresponding to the measured current value, in place of the ammeter 12. The FIB apparatus 104 further comprises a controller 20 including, e.g., a microcomputer in addition to the components of the FIB apparatus 101, and has an interlocking function provided by the controller 20. More specifically, the controller 20 controls the driver 22 by using a signal S22 to control the operation of the probe 2. Further, the controller 20 receives the signal S12 outputted from the ammeter 12b to detect the contact between the probe 2 and the sample 5 based on a change in the signal S12. Upon detecting the contact, the controller 20 stops the driver 22, that is, stops controlling the distance between the probe 2 and the sample 5 by means of the driver 22.

Figure 14:
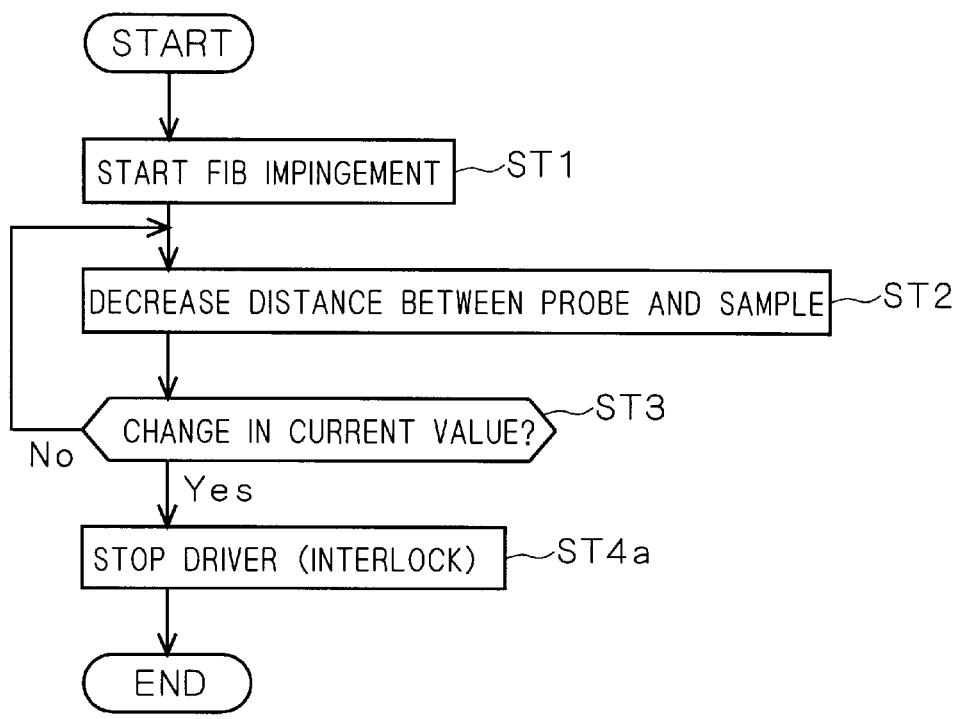
FIG. 14 is a flow chart for illustrating a method of controlling the FIB apparatus according to the fourth preferred embodiment.

FIG. 14 is a flowchart for illustrating a method of controlling the FIB apparatus 104 when detecting the contact between the probe 2 and the sample 5. As shown in FIG. 14, the above-mentioned interlocking function is used to stop the operation of the driver 22 in Step ST4a of this method which corresponds to Step ST4 of FIG. 5. Steps ST1 to ST3 of FIG. 14 are similar to those of FIG. 5.

The FIB apparatus 104, which has the interlocking function provided by the controller 20, can more reliably stop the driver 22 upon detection of the contact between the probe 2 and the sample 5 than the technique of controlling the driver 22, for example, manually. This further reduces damages to the sample 5, particularly the future TEM sample portion.

Consequently, more correct analysis using the cut TEM sample can be carried out.

Figure 15:
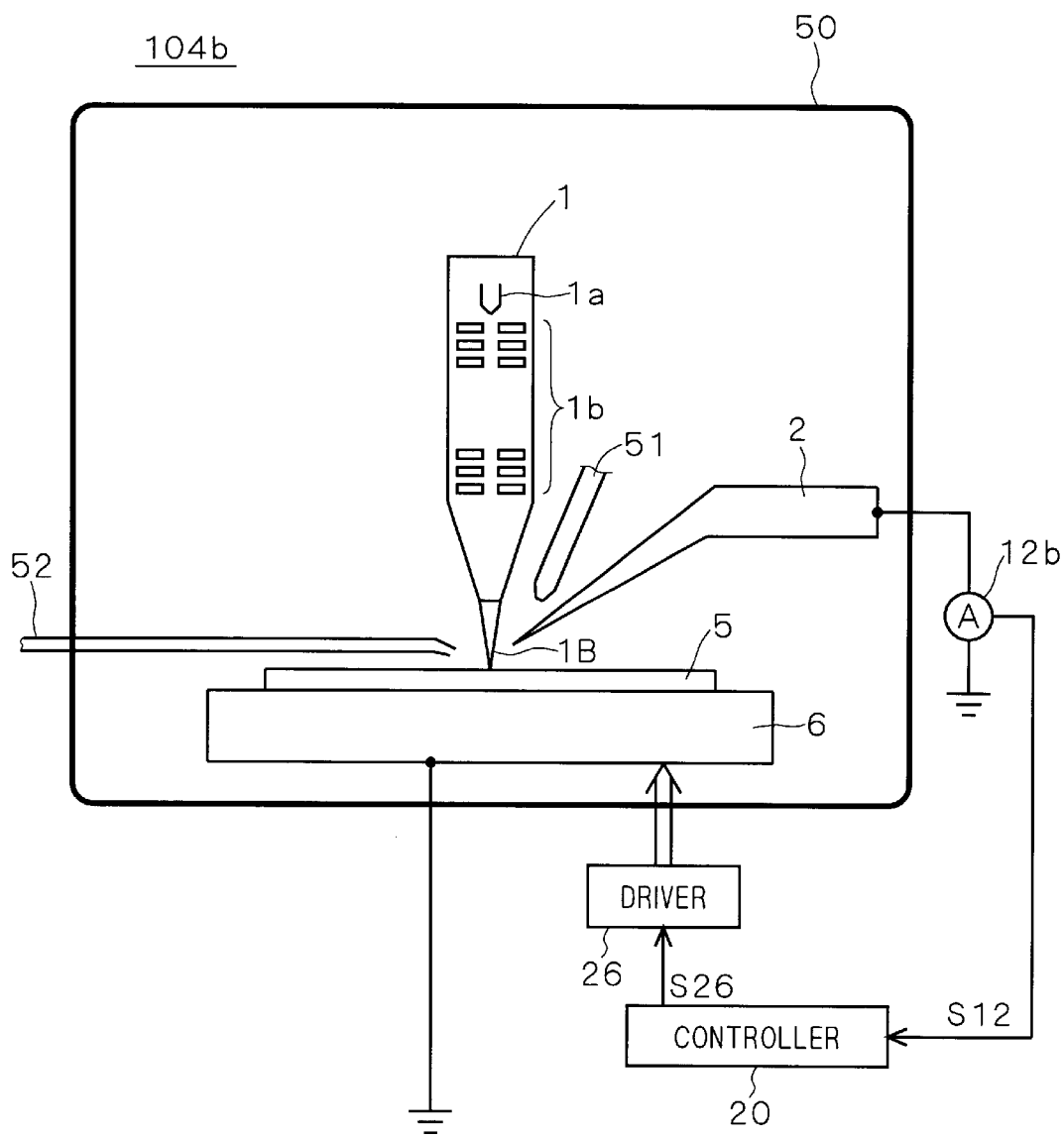
FIG. 15 is a schematic view of another structure of the FIB apparatus according to the fourth preferred embodiment.

An FIB apparatus 104b as shown in FIG. 15 may be employed in which the interlocking function is added to the FIB apparatus 101b of FIG. 6. More specifically, the controller 20 of the FIB apparatus 104b controls the driver 26 by using a signal S26 to control the operation of the sample stage 6. Further, the controller 20 of the FIB apparatus 104b receives the signal S12 outputted from the ammeter 12b, and stops the operation of the driver 26 upon detection of the contact between the probe 2 and the sample 5. The FIB apparatus 104b can also produce effects similar to those of the FIB apparatus 104. The interlocking function provided by the controller 20 may be added to the FIB apparatus 101c of FIG. 7.

<First Modification of Fourth Preferred Embodiment>

An FIB apparatus 104c as shown in FIG. 16 can produce effects similar to those of the FIB apparatus 104.

A comparison between FIGS. 8 and 16 shows that the FIB apparatus 104c comprises an ammeter 16b which is capable of outputting a signal S16 corresponding to the measured current value, in place of the ammeter 16. The FIB apparatus 104c further comprises the controller 20 in addition to the components of the FIB apparatus 102, and has the interlocking function provided by the controller 20. More specifically, the controller 20 controls the driver 22 by using the signal S22 to control the operation of the probe 2. Further, the controller 20 receives the signal S16 outputted from the ammeter 16b to detect the contact between the probe 2 and the sample 5 based on a change in the signal S16. Upon detecting the contact, the controller 20 stops the driver 22, that is, stops controlling the distance between the probe 2 and the sample 5 by means of the driver 22.

Figure 17:
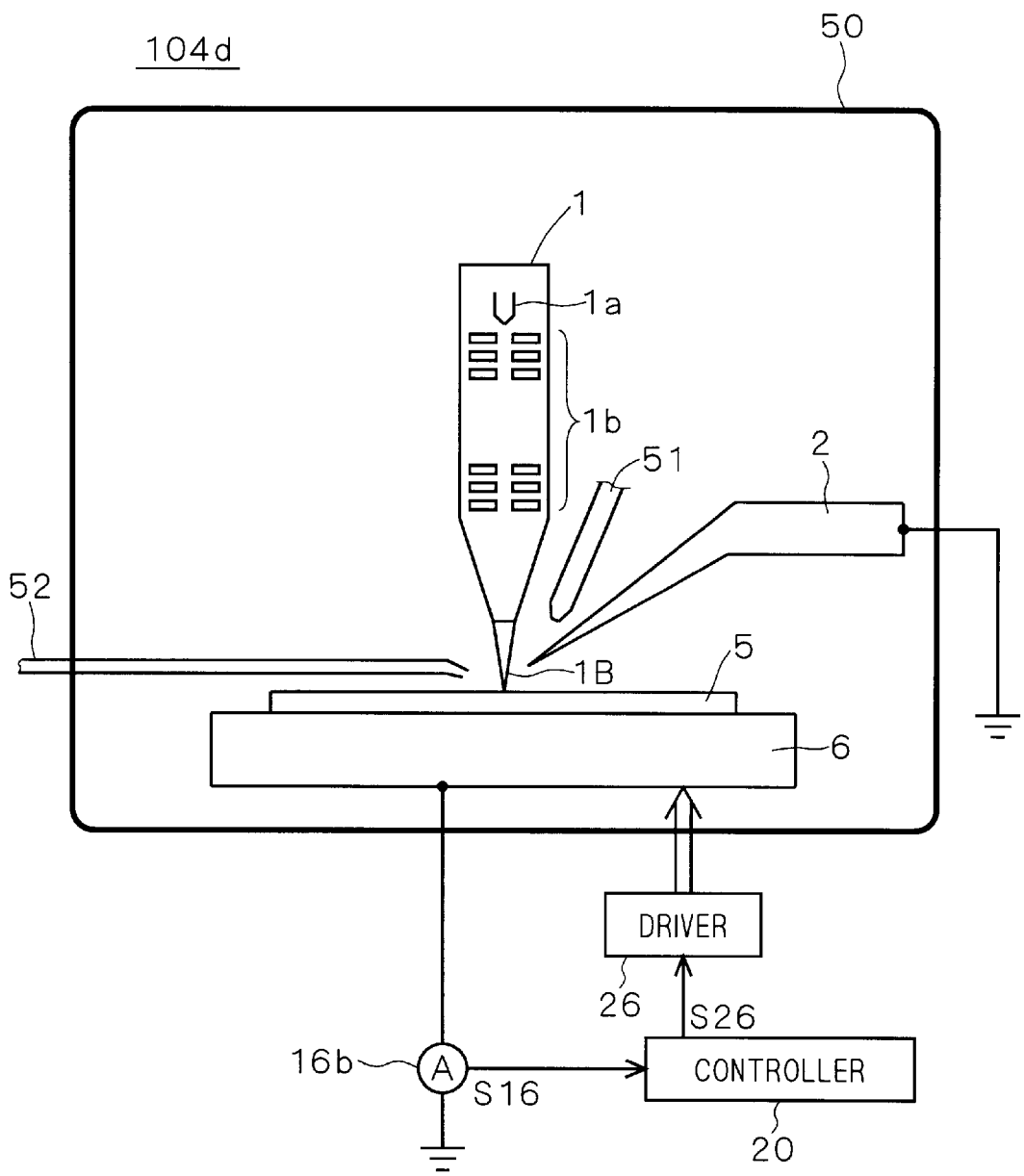
FIG. 17 is a schematic view of another structure of the FIB apparatus according to the first modification of the fourth preferred embodiment.

An FIB apparatus 104d as shown in FIG. 17 may be employed which comprises the driver 26 in place of the driver 22 of the FIB apparatus 104c of FIG. 16 so that the controller 20 of the FIB apparatus 104d controls the driver 26 in a manner similar to the controller 20 of the FIB apparatus 104c.

<Second Modification of Fourth Preferred Embodiment>

First to fourth FIB apparatuses 104e to 104h according to a second modification of the fourth preferred embodiment will be described with reference to FIGS. 18 through 21.

Figure 18:
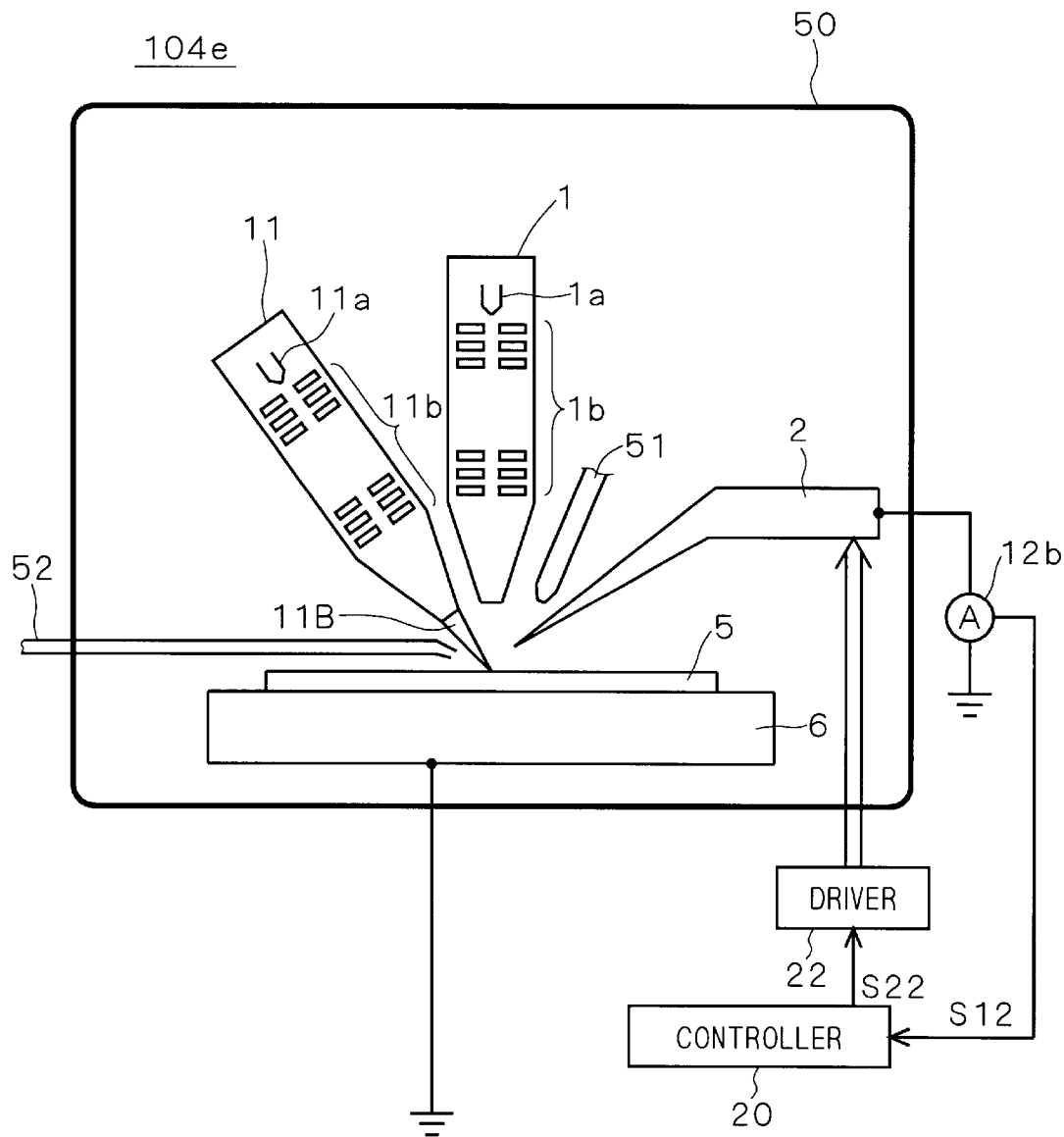
FIG. 18 is a schematic view of a first structure of the FIB apparatus according to a second modification of the fourth preferred embodiment.
Figure 19:
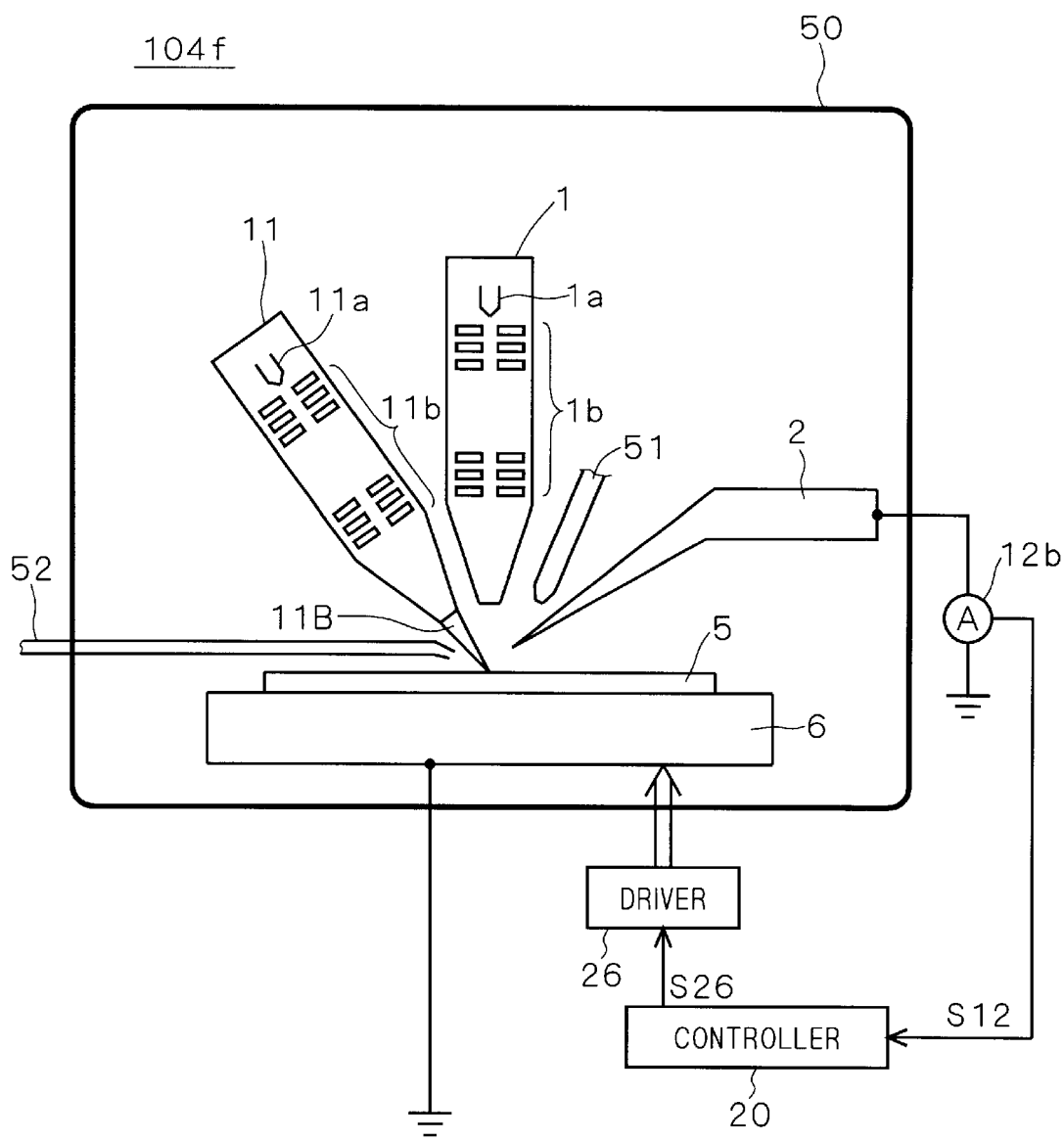
FIG. 19 is a schematic view of a second structure of the FIB apparatus according to the second modification of the fourth preferred embodiment.

With reference to FIG. 18, the first FIB apparatus 104e is such that the ammeter 12 of the FIB apparatus 103 of FIG. 10 is replaced with the ammeter 12b, and further comprises the controller 20. As shown in FIG. 19, the second FIB apparatus 104f may comprise the driver 26 in place of the driver 22 of the first FIB apparatus 104e.

Figure 20:
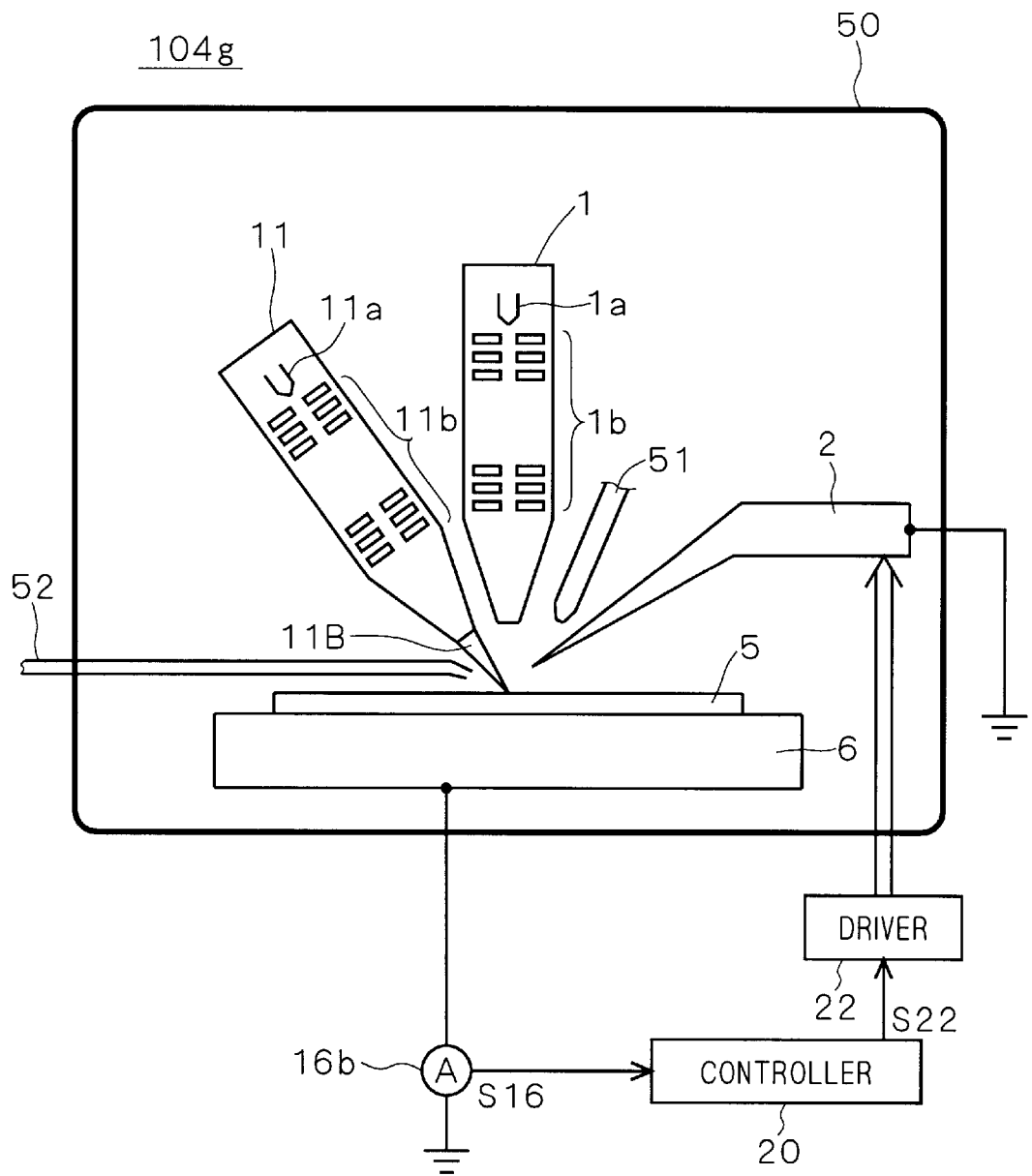
FIG. 20 is a schematic view of a third structure of the FIB apparatus according to the second modification of the fourth preferred embodiment.
Figure 21:
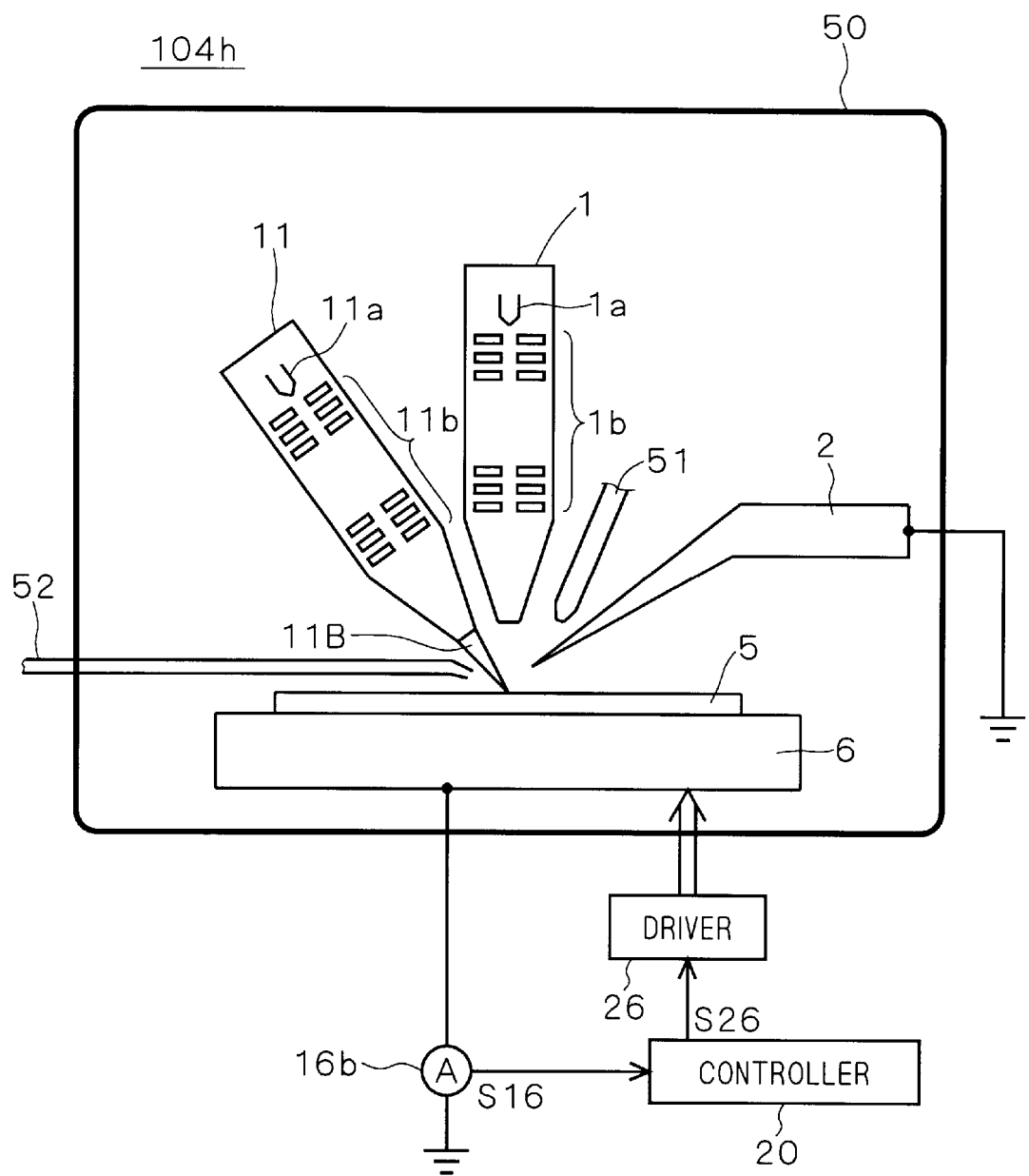
FIG. 21 is a schematic view of a fourth structure of the FIB apparatus according to the second modification of the fourth preferred embodiment.

With reference to FIG. 20, the third FIB apparatus 104g is such that the ammeter 16 of the FIB apparatus 103b of FIG. 12 is replaced with the ammeter 16b, and further comprises the controller 20. As shown in FIG. 21, the fourth FIB apparatus 104h may comprise the driver 26 in place of the driver 22 of the third FIB apparatus 104g.

The FIB apparatuses 104e to 104h may have the above-mentioned effects resulting from the interlocking function of the controller 20. Further, other FIB apparatuses described above, such as the FIB apparatus 102b, may have the interlocking function to produce the above-mentioned effects.

While the invention has been described in detail, the foregoing description is in all aspects illustrative and not restrictive. It is understood that numerous other modifications and variations can be devised without departing from the scope of the invention.

What is claimed is:

1. A charged particle beam apparatus comprising:
   a charged particle beam generator configured to generate at least one charged particle beam, including a focused ion beam;
   a probe disposed in face-to-face relation with a sample;
   a driver for controlling a distance between said probe and said sample; and
   an ammeter electrically connected to at least one of said probe and said sample for measuring current produced by said at least one charged particle beam and flowing through at least one of said probe and said sample when said distance between said probe and said sample is decreased while said at least one charged particle beam generated by said charged particle beam generator is directed onto at least said sample.

2. The charged particle beam apparatus according to claim 1,
   wherein said ammeter outputs a signal corresponding to a value of said current measured,
   said focused ion beam apparatus further comprising
   a controller receiving said signal for stopping controlling said distance between said probe and said sample by means of said driver, based on a change in said signal.

3. The charged particle beam apparatus according to claim 2,
   wherein said at least one charged particle beam is said focused ion beam.

4. The charged particle beam apparatus according to claim 2,
   wherein said charged particle beam generator is configured to generate an electron beam, and
   wherein said at least one charged particle beam is said electron beam.

5. The charged particle beam apparatus according to claim 1,
   wherein said at least one charged particle beam is said focused ion beam.

6. The charged particle beam apparatus according to claim 1,
   wherein said charged particle beam generator is configured to generate an electron beam, and
   wherein said at least one charged particle beam is said electron beam.

7. The charged particle beam apparatus according to claim 1,
   wherein the current flows through both said probe and said sample when said probe and said sample are in electrical contact with each other.

8. A method of controlling a charged particle beam apparatus including a charged beam generator configured to generate at least one charged particle beam, including a focused ion beam, a probe disposed in face-to-face relation with a sample, and a driver for controlling a distance between said probe and said sample, said method comprising the steps of:
   measuring current produced by said at least one charged particle beam and flowing through at least one of said probe and said sample when said distance between said probe and said sample is decreased while said at least one charged particle beam generated by said charged particle beam generator is directed onto at least said sample; and
   stopping controlling said distance between said probe and said sample, based on a change in said current.

9. The method according to claim 8, wherein said at least one charged particle beam is said focused ion beam.

10. The method according to claim 8, wherein said charged particle beam generator is configured to generate an electron beam, and wherein said at least one charged particle beam is said electron beam.

11. The method according to claim 8, further comprising a step of:

bringing said probe into electrical contact with said sample, wherein the current flows through both said probe and said sample.

12. A charged particle beam apparatus comprising:

a sample stage;

a charged particle beam generator aimed toward a surface of said sample stage which is configured to hold a sample;

a probe configured to move in relation to said surface towards said sample, said probe being configured to move at least to a first position or to a second position; and an ammeter configured to measure a current from at least one charged particle beam including a focused ion beam of the charged particle beam generator;

wherein the first position of said probe is associated with a first amount of said current and the second position of said probe is associated with a second amount of said current which is larger than the first amount of said current, the second amount of said current flowing through the probe and at least one of the said sample stage or said sample.

13. The charged particle beam apparatus of claim 12, wherein said sample stage is configured to hold the sample on said surface which is in electrical contact with the sample; and wherein the probe is in electrical contact with the sample in the second position, and the probe is not in electrical contact with the sample in the first position.

14. The charged particle beam apparatus of claim 12, wherein the second amount of said current comprises current generated in the sample and flowing into said probe.

15. The charged particle beam apparatus of claim 12, further comprising:

a driver configured to control movement of said probe.

16. The charged particle beam apparatus of claim 12, wherein said charged particle beam generator scans said at least one charged particle beam within a scan area defined on the surface of said sample stage; and wherein, in said second position, the probe and the sample make electrical contact within said at least one charged particle beam.

17. The charged particle beam apparatus of claim 12, further comprising:

an ion source configured to produce a ion cutting beam for cutting the sample;

wherein said at least one charged particle beam of the charged particle beam generator has a lower energy than the ion cutting beam.

* * * * *